United States Patent [19]
Takata et al.

[11] Patent Number: 5,777,921
[45] Date of Patent: Jul. 7, 1998

[54] NON-VOLATILE SEMICONDUCTOR MEMORY DEVICE

[75] Inventors: Hidekazu Takata; Hidehiko Tanaka, both of Nara, Japan

[73] Assignee: Sharp Kabushiki Kaisha, Osaka, Japan

[21] Appl. No.: 821,024

[22] Filed: Mar. 19, 1997

[30] Foreign Application Priority Data

Mar. 25, 1996  [JP]  Japan ................................. 8-068837

[51] Int. Cl.$^6$ ................................................. G11C 11/22
[52] U.S. Cl. ................................................. 365/145; 365/222
[58] Field of Search ................................. 365/145, 222, 365/149, 102, 228, 185.11, 185.13, 230.03

[56] References Cited

U.S. PATENT DOCUMENTS

| | | | |
|---|---|---|---|
| 5,488,587 | 1/1996 | Fukumoto | 365/222 |
| 5,528,535 | 6/1996 | Honjo et al. | 365/222 |
| 5,539,279 | 7/1996 | Takeuchi et al. | 365/149 |
| 5,550,770 | 8/1996 | Kuroda | 365/145 |

*Primary Examiner*—Tan T. Nguyen
*Attorney, Agent, or Firm*—Morrison & Foerster, LLP

[57] ABSTRACT

A non-volatile semiconductor memory device includes a plurality of memory cells each including a capacitor as a memory element, the capacitor sandwiching a ferroelectric member. The non-volatile semiconductor memory device further includes: a first counter for counting the number of write accesses and read accesses for writing or reading first logic data to each one of the plurality of memory cells; a second counter for counting the number of write accesses and read accesses for writing or reading second logic data to the memory cell; and a refresh control circuit for performing, when either a first value counted by the first counter or a second value counted by the second counter exceeds a predetermined value, a refresh operation by applying electric fields for causing a polarization state of the ferroelectric member of the capacitor to make a complete round on a hysteresis curve of the ferroelectric member in a corresponding one of the plurality of memory cells for which the first or second value counted by the first counter or the second counter has exceeded the predetermined value.

7 Claims, 15 Drawing Sheets

NON-VOLATILE SEMICONDUCTOR MEMORY DEVICE

BACKGROUND OF THE INVENTION

1. Field of the Invention

The present invention relates to a non-volatile semiconductor memory device including capacitors as memorizing elements, each capacitor sandwiching a ferroelectric film therein. More particularly, the present invention relates to a non-volatile semiconductor memory device capable of preventing the deterioration of the memory cells caused by a decrease in the spontaneous polarization of the ferroelectric material.

2. Description of the Related Art

There is a class of non-volatile semiconductor memory devices known as FRAMs (ferroelectric random access memories), which include capacitors as memorizing elements such that each capacitor sandwiches a ferroelectric film therein. As shown in FIG. 17, each memory cell of a FRAM includes a capacitor CS (sandwiching a ferroelectric film therein) and an n-channel MOS transistor Q. The capacitor CS includes one electrode coupled to a drive line DL and an electrode coupled to a bit line BL via the MOS transistor Q. The gate of the MOS transistor Q is coupled to a word line WL. The polarization state of the ferroelectric film sandwiched in the capacitor CS has, for example, the hysteresis characteristics shown in FIG. 18 when positive and negative electric fields are repeatedly applied across its electrodes. As seen from FIG. 18, it is possible to store binary logic data in the FRAM in a non-volatile manner by utilizing two remanence levels, i.e., the remanence at point B (which may corresponding to, e.g., data "1") and the remanence at point D (which may correspond to, e.g., data "0"), that are obtained after the application of an electric field is stopped.

A read access for reading data from a memory cell in the above-mentioned FRAM is performed as follows. Initially, the potentials of the bit line BL, the word line WL, and the drive line DL are all set to the L or Low level (i.e., the GND level). After leaving the bit line BL in a floating state, the word line WL is raised to the H or High level (i.e., the Vcc level) to turn the MOS transistor Q on, and the drive line DL is also raised to the H level. Then, an electric field is applied across the electrodes of the capacitor CS, so that the data which was stored in the memory cell is read to the bit line BL via the MOS transistor Q.

Specifically, a negative electric field shown in FIG. 18 is applied to the ferroelectric film in the capacitor CS so that the polarization state thereof shifts from point B to point C, i.e., inverted, in the case where data "1" was stored in the memory cell. On the other hand, in the case where data "0" was stored in the memory cell, the polarization state of the ferroelectric film merely shifts from point D to point C without being inverted. The floating bit line BL allows a larger number of negative charges to be used by the capacitor CS in the case where data "1" was stored in the memory cell (therefore causing a polarization inversion) than in the case where data "0" was stored in the memory cell (therefore causing no polarization inversion). Therefore, the potential of the bit line BL slightly varies depending on whether or not a polarization inversion occurred. By sensing such variations in the potential of the bit line BL by means of a sense amplifier, the data stored in the memory cell can be read.

In the case where data "0" is read in the above operation, the polarization state of the ferroelectric film returns to point D as the drive line DL is lowered back to the L level, thereby maintaining the memory cell's previous state (i.e., D→C→D). On the other hand, in the case where data "1" is read in the above operation, the polarization state of the ferroelectric film has already been inverted, that is, the stored data has been destroyed. Accordingly, when lowering the drive line DL back to the L level, the data is rewritten to the memory cell by utilizing the potential of the bit line BL (which has been raised to the H level by the sense amplifier), thereby inverting the polarization state of the ferroelectric film from point D to point A (i.e., B→C→D→A→B) to restore the previous state of the memory cell.

A write access for writing data "1" to the above memory cell is performed as follows. While placing the bit line BL at the H level, the word line WL is raised to the H level. After switching the drive line DL to the H level, the word line WL is lowered back to the L level. In the case where data "1" was stored in the memory cell, the polarization state of the ferroelectric film merely shifts from point B to point A and back to point B without being inverted (i.e., B→A→B). On the other hand, in the case where data "0" was stored in the memory cell, the polarization state, of the ferroelectric film is first inverted from point D to point A and then shifts to point B (i.e., D→A→B).

A write access for writing data "0" to the above memory cell is performed as follows. While placing the bit line BL at the L level, the word line WL is raised to the H level. After switching the drive line DL to the H level, the word line WL is lowered back to the L level. In the case where data "1" was stored in the memory cell, the polarization state of the ferroelectric film is first inverted from point B to point C and then shifts to point D (i.e., B→C→D). On the other hand, in the case where data "0" was stored in the memory cell, the polarization state of the ferroelectric film merely shifts from point D to point C and back to point D without being inverted (i.e., D→C→D).

It will be understood from the above that, during a read access for reading data "1", both positive and negative electric fields are applied to the ferroelectric film so that the polarization state thereof transits around the hysteresis curve by one complete round. However, in the other read access and both writing accesses, only a positive or negative electric field is applied to the ferroelectric film of the capacitor CS, regardless of whether or not the access has caused a polarization inversion.

The repetitive application of either a positive electric field or a negative electric field (as opposed to alternately applying both positive and negative electric fields) may result in an imprinting effect that causes the spontaneous polarization of the ferroelectric film to decrease. The imprinting effect, which occurs due to the ionization effect of the crystal structure composing the ferroelectric material or an internal stress (i.e., change in the polarization state) stored therein, lowers the spontaneous polarization as shown in FIG. 19. Specifically, as shown in FIG. 19, the imprinting effect causes the hysteresis curve of the ferroelectric material to shift in the direction of polarization, thereby changing the anti-electric field (defined as the minimum electric field that causes an inversion of the spontaneous polarization: indicated in FIG. 18).

Thus, if read accesses for reading data "0" are repeated, or if write accesses for writing either data "1" or data "0" are repeated, the spontaneous polarization of the ferroelectric film may deteriorate, thereby reducing the reliability of the memory cell and hence the reliability of the FRAM.

However, the deterioration of the spontaneous polarization is known to be restored by relaxing the ferroelectric film by performing a refreshing operation, i.e., by applying a positive electric field and/or a negative electric field to the capacitor CS of the memory cell so as to cause the polarization state of the ferroelectric film to transit around the hysteresis curve by one complete round.

Therefore, a conventional approach to cope with the problem of the imprinting effect has been to universally refresh all the memory cells after the counted number of accesses to the FRAM has exceeded a predetermined value, indicating that at least one memory cell of the FRAM includes a capacitor CS whose ferroelectric film has seen a deterioration in spontaneous polarization, thereby restoring the reliability of the FRAM. The "refresh operation", as used herein, is defined as an operation for restoring the reliability of the FRAM, as opposed to a "refresh operation" performed for conserving the data stored in a DRAM (dynamic random access memory).

Japanese Laid-Open Patent Publication No. 7-73682 discloses an invention where an access counter is provided for each word line or a drive line (plate line) of a FRAM for counting the number of times the word or drive line has been selected, so that when the number counted by any one of the access counter has exceeded a predetermined value, all the memory cells coupled to that word or drive line are refreshed. Thus, the refresh operation in this invention is performed on a word or drive line basis. Moreover, this invention employs a non-volatile memory (e.g., memory cells of a FRAM) as a memory means for temporarily saving the data stored in the relevant memory cell during a refresh operation, thereby securing the stored data in case the power is accidentally shut off during a compulsory refresh operation.

However, accesses may occur more frequently for one address of a FRAM than another. In fact, it is usually the case that the accesses concentrate on a number of addresses present in certain regions of the FRAM. Therefore, conventional FRAMs, which are designed to universally refresh all the memory cells after the counted number of accesses to the FRAM as a whole has exceeded a predetermined value, will perform redundant refresh operations for a large number of memory cells in address regions where accesses do not occur very often.

Moreover, refreshing all the memory cells of a FRAM requires a considerable amount of time. Performing such time-requiring refreshing operations after every time a predetermined number of accesses has been counted may result in a situation where an access that needs to be made must wait until the refreshing operation is over. In other words, conventional FRAMs have a problem in that their access efficiency is reduced due to redundant refresh operations.

A FRAM disclosed in Japanese Laid-Open Patent Publication No. 7-73682 is capable of refreshing on a word line or drive line basis, so that only memory cells in address regions which are frequently accessed are refreshed. Therefore, the problem of redundant refreshing for memory cells which are hardly accessed is reduced. Moreover, since only the memory cells that are coupled to the same word line or drive line are refreshed at the same time, a smaller amount of time is required for each refresh operation, which prevents decrease in the access efficiency.

However, the refreshing operations in the FRAM of Japanese Laid-Open Patent Publication No. 7-73682 are still performed on a block basis, i.e., directed to the memory cells coupled to the same word line or drive line. Since the number of memory cells in one block increases with the increase in capacity of FRAMs, the number of memory cells which are hardly accessed within one block has also been increasing in recent years, so that the redundant refreshing for those hardly-accessed memory cells is no longer negligible.

In addition, the FRAM of Japanese Laid-Open Patent Publication No. 7-73682 requires a memory means for temporarily saving the data originally stored in the target memory cell while the memory cell receives a refresh operation.

SUMMARY OF THE INVENTION

A non-volatile semiconductor memory device according to the present invention includes a plurality of memory cells each including a capacitor as a memory element, the capacitor sandwiching a ferroelectric member, wherein the non-volatile semiconductor memory device further includes: a first counter for counting the number of write accesses and read accesses for writing or reading first logic data to each one of the plurality of memory cells; a second counter for counting the number of write accesses and read accesses for writing or reading second logic data to the memory cell; and a refresh control circuit for performing, when either a first value counted by the first counter or a second value counted by the second counter exceeds a predetermined value, a refresh operation by applying electric fields for causing a polarization state of the ferroelectric member of the capacitor to make a complete round on a hysteresis curve of the ferroelectric member in a corresponding one of the plurality of memory cells for which the first or second value counted by the first counter or the second counter has exceeded the predetermined value.

In one embodiment of the invention, the first counter does not count any read accesses for reading the first logic data in the case where the polarization state of the ferroelectric member is inverted by reading the first logic data from the corresponding memory cell.

In another embodiment of the invention, the first counter resets the counted first value when a read access for reading the first logic data is made in the case where the polarization state of the ferroelectric member is inverted by reading the first logic data from the corresponding memory cell.

In still another embodiment of the invention, the refresh control circuit performs, when the first value counted by the first counter exceeds a predetermined value, a refresh operation by reading the first logic data from the corresponding memory cell and subsequently rewriting the first logic data to the corresponding memory cell at least one time, and the refresh control circuit performs, when the second value counted by the second counter exceeds a predetermined value, a refresh operation by reading the logic data from the corresponding memory cell, writing data which is obtained by inverting the logic data, and subsequently writing the non-inverted logic data to the corresponding memory cell at least one time.

Alternatively, the non-volatile semiconductor memory device according to the present invention includes $2^{(n_1+n_2)}$ memory cells arrayed in a matrix of $2^{n_1}$ rows×$2^{n_2}$ columns, each memory cell including a capacitor as a memory element, the capacitor sandwiching a ferroelectric member, at least one of the memory cells being selected based on a row address of $n_1$ bits and a column address of $n_2$ bits for an access, wherein the non-volatile semiconductor memory device further includes: a row predecoder for predecoding $m_1$ bits among the $n_1$ bits of the row address; $2^{m_1}$ row subdecoders for subdecoding the other $(n_1-m_1)$ bits to select at least one row of the arrayed memory cells, at least one of the $2^{m_1}$ row subdecoders being selected based on an output of the row predecoder; a column predecoder for predecoding $m_2$ bits among the $n_2$ bits of the column address; $2^{m_2}$ column subdecoders for subdecoding the other $(n_2-m_2)$ bits to select at least one column of the arrayed memory cells, at least one of the $2^{m_2}$ column subdecoders being selected based on an output of the column predecoder; a plurality of counters for counting the number of accesses to the memory cells in each block selected based on a combination of the output of the row predecoder and the output of the column predecoder; and a refresh control circuit for performing, when a counted value counted by at least one of the plurality of counters exceeds a predetermined value, a refresh operation by applying electric fields for causing a polarization state of the ferroelectric member of the capacitor of all the memory cells within the block corresponding to the counter whose counted value has exceeded the predetermined value to make a complete round on a hysteresis curve of the ferroelectric member.

In one embodiment of the invention, the plurality of counters include: first counters for counting the number of write accesses and read accesses for writing or reading first logic data to the memory cells within the block; second counters for counting the number of write accesses and read accesses for writing or reading second logic data to the memory cells within the block, and wherein the refresh control circuit performs, when a counted value counted by at least one of the first counters or the second counters exceeds a predetermined value, a refresh operation for all the memory cells within the block corresponding to the counter whose counted value has exceeded the predetermined value.

In another embodiment of the invention, the refresh control means performs refresh operations for all the memory cells within the block, the memory cells being sequentially selected by: selecting a column of the block by subdecoding the column address of $(n_2-m_2)$ bits obtained by counting a pulse sequence having a predetermined cycle by using a column refresh counter; and selecting a row of the block by subdecoding the row address of $(n_1-m_1)$ bits obtained by counting a further pulse sequence by using a row refresh counter, the further pulse sequence being obtained by dividing the pulse sequence having the predetermined cycle by $2^{(n_2-m_2)}$.

Thus, the invention described herein makes possible the advantage of providing: a non-volatile semiconductor memory device capable of refreshing on a memory cell basis or on the basis of a block of a desired size, such that a refresh operation may or may not be performed in accordance with the kinds of accesses that have been made. As a result, redundant refresh operations are reduced, thereby preventing decrease in access efficiency.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

(EXAMPLE 1)

FIGS. 1 to 8 are diagrams showing a non-volatile semiconductor memory device according to Example 1 of the present invention.

Figure 1:
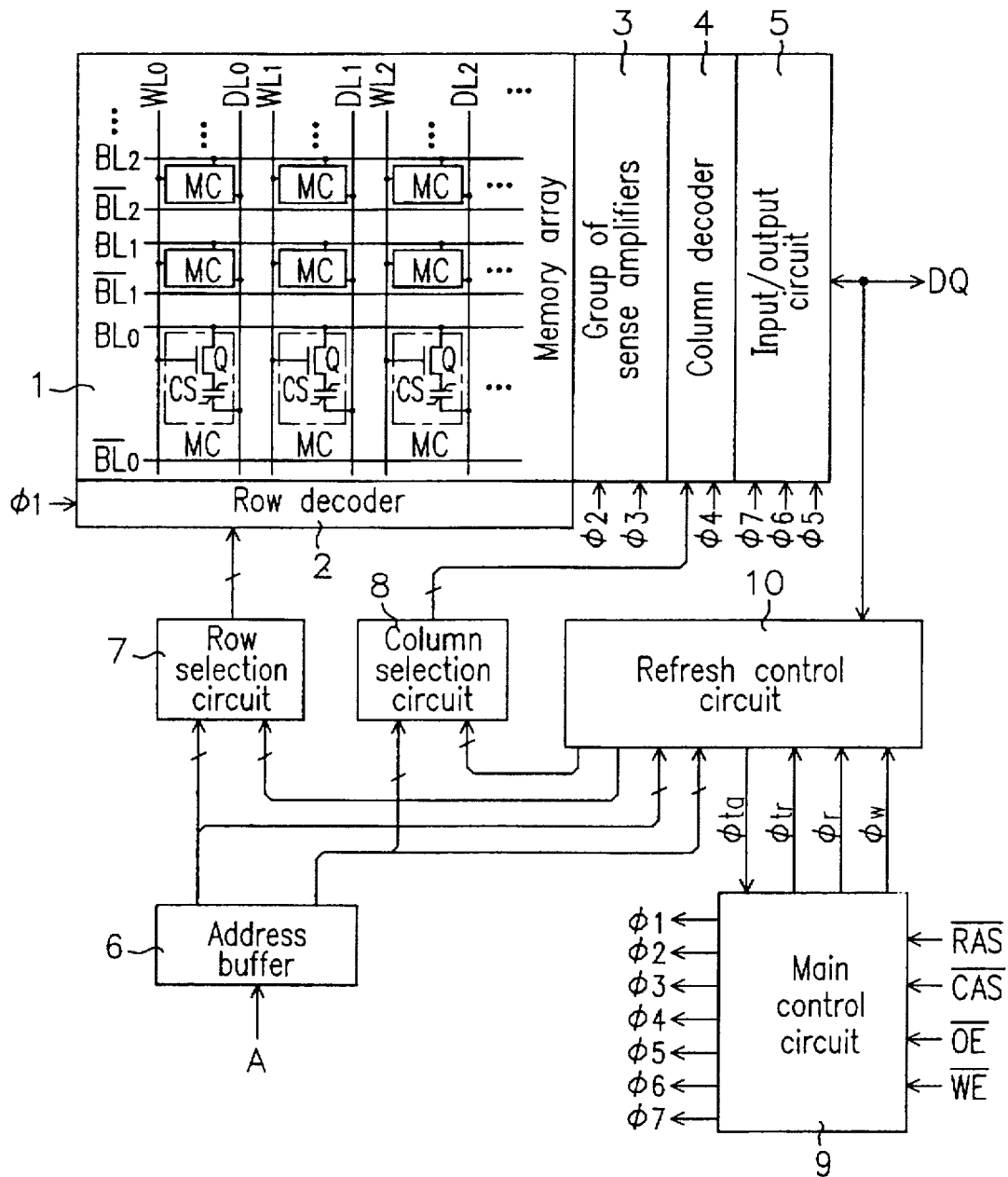
FIG. 1 is a block diagram illustrating an exemplary configuration of a non-volatile semiconductor memory device according to Example 1 of the present invention.

Referring to FIG. 1, a non-volatile semiconductor memory device according to Example 1 of the present invention is illustrated, which incorporates a counter for counting the number of accesses made to each memory cell MC. As shown in FIG. 1, the non-volatile semiconductor memory device includes a memory cell array including a plurality of memory cells MC. Specifically, the memory cell array 1 includes a plurality of bit lines BL extending along the column direction, a plurality of complimentary bit lines $\overline{BL}$ extending along the column direction, a plurality of word lines WL extending along the row direction, and a plurality of drive lines DL extending along the row direction. Each memory cell MC is disposed so as to correspond to appropriate intersections of these lines, thereby forming a matrix.

Figure 17:
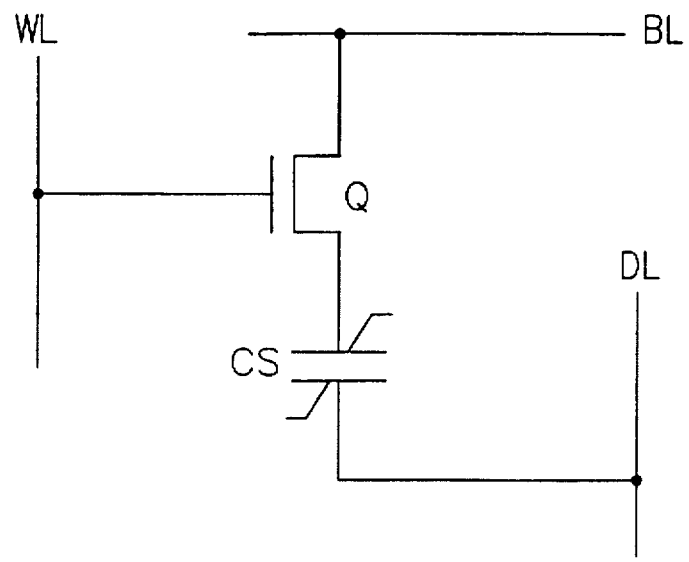
FIG. 17 is a circuit diagram showing a memory cell of a FRAM.

As in the memory cell MC shown in FIG. 17, each memory cell MC includes a capacitor CS (sandwiching a ferroelectric film) and an n-channel MOS transistor Q. The capacitor CS includes one electrode coupled to an adjoining drive line DL and an electrode coupled to an adjoining bit line BL via the MOS transistor Q. The gate of the MOS transistor Q is coupled to an adjoining word line WL. A row decoder 2 selects a word line WL of the memory cell array 1.

Each bit line $\overline{BL}$ and each complimentary bit line $\overline{BL}$ are coupled to each sense amplifier in a group of sense amplifiers 3. The output of a bit line BL or a sense amplifier selected by the column decoder 4 is coupled to an input/output circuit 5. Each sense amplifier in the group of sense amplifiers 3 is a circuit for detecting and amplifying a minute difference in potential between each bit line BL and each complimentary bit line $\overline{BL}$. The input/output circuit 5 outputs the data amplified by the sense amplifier as read data DQ to the exterior of the memory device and sends write data DQ supplied from the exterior of the memory device to a bit line BL and a complimentary bit line $\overline{BL}$.

An address A supplied from the exterior of the memory device is divided into a row address and a column address via an address buffer 6. The row address is sent to the row decoder 2 via a row selection circuit 7, whereas the column address is sent to the column decoder 4 via a column selection circuit 8. Thus, a memory cell MC in the memory cell array 1 is selected in accordance with the row address and the column address, so that a write access or a read access is made to the selected memory cell MC. At this time, in accordance with a row address strobe signal $\overline{RAS}$, a column address strobe signal $\overline{CAS}$, and output enable signal $\overline{OE}$, and a write enable signal $\overline{WE}$, which are supplied from the exterior of the memory device, a main control circuit 9 generates internal control signals φ1 to φ7 to the row decoder 2, the group of sense amplifiers 3, the column decoder 4, and the input/output circuit 5 so as to control the accessing operations performed thereby.

Figure 2:
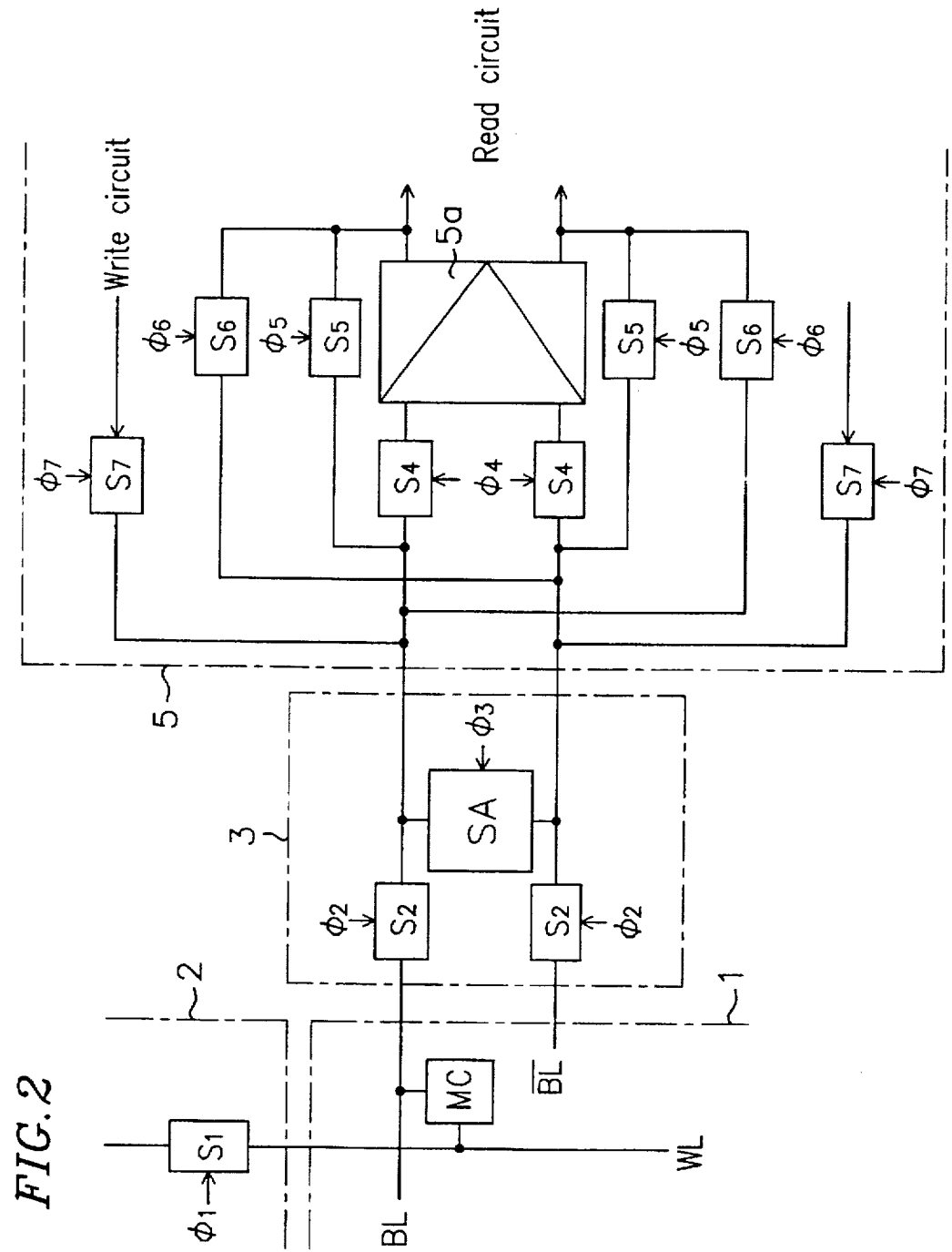
FIG. 2 is a block diagram illustrating an exemplary interconnection between bit lines and an input/output circuit according to Example 1 of the present invention.

The control of the accessing operations based on the internal control signals φ1 to φ7 is described in more detail with reference to FIG. 2. In FIG. 2, switches S1, S2, S4 to S7 each represent a switch circuit composed essentially of a MOS transistor which is turned on when an internal control signal φ input to its gate becomes active. The internal control signal φ1 is input to the gate of the switch S1 to control the time at which the word line WL rises. The internal control signal φ2 is input to the gates of the switches S2 to control the time at which the bit line BL and the complimentary bit line $\overline{BL}$ are coupled to a sense amplifier SA in the group of sense amplifiers 3. The internal control signal φ3 is input to the sense amplifier SA to control the time at which the sense amplifier SA is driven. The internal control signal φ4 is input to the gates of the switches S4 to control the time at which the output of the sense amplifier SA is transferred to a buffer amplifier 5a of the input/output circuit 5. The internal control signal φ5 is input to the gates of the switches S5 to control the time at which the data which has been inverted and output by the buffer amplifier 5a to the bit line BL and the complimentary bit line $\overline{BL}$. The internal control signal φ6 is input to the gates of the switches S6 to control the time at which the data which has been inverted and output by the buffer amplifier 5a is reconverted into a non-inverted signal to be transferred to the bit line BL and the complimentary bit line $\overline{BL}$. The internal control signal φ7 is input to the gates of the switches S7 to control the time at which the data which has been input to the input/output circuit 5 from the exterior of the memory device is transferred to the bit line BL and the complimentary bit line $\overline{BL}$.

Figure 3:
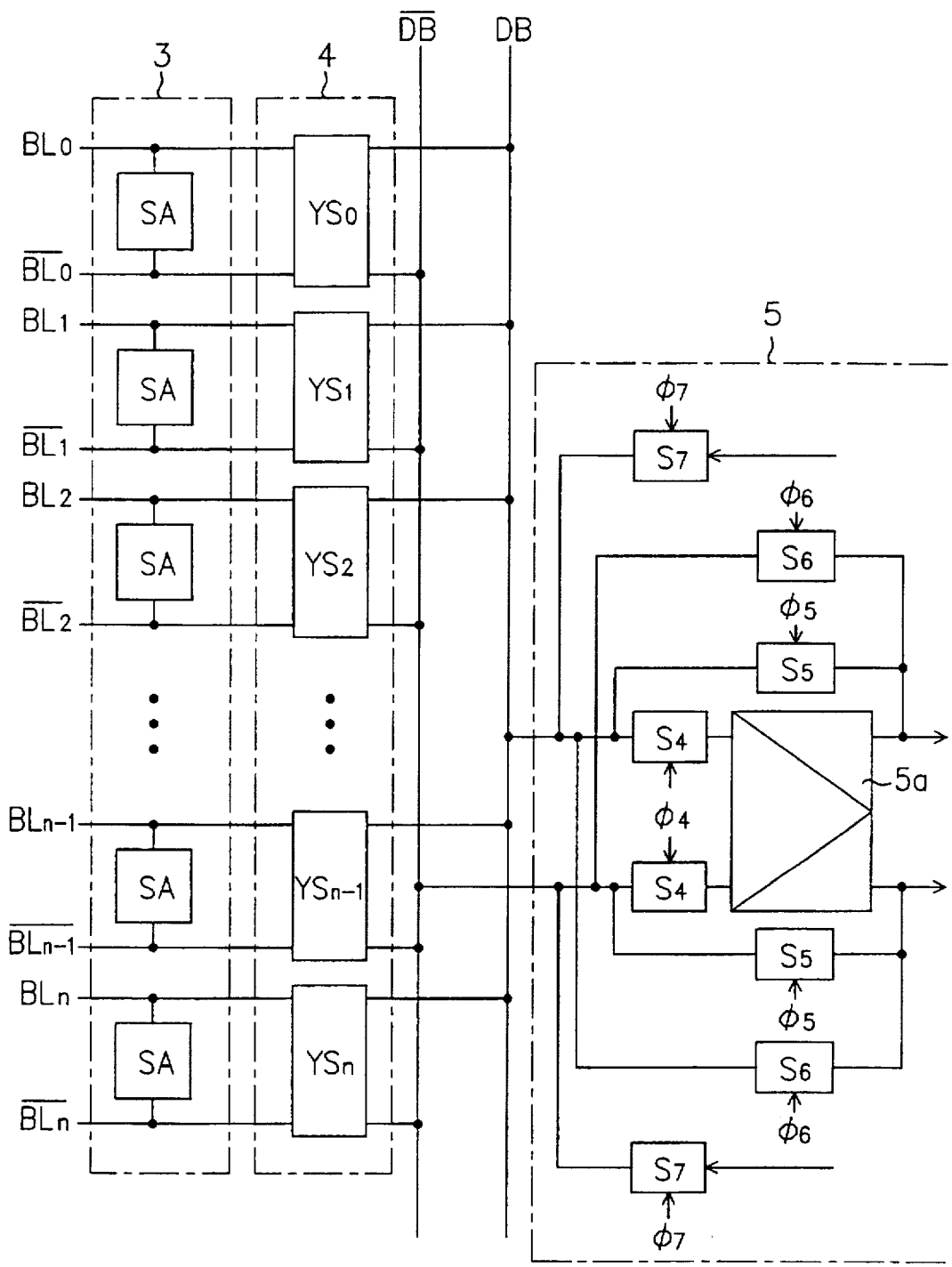
FIG. 3 is a block diagram illustrating another exemplary interconnection between bit lines and an input/output circuit according to Example 1 of the present invention.

Although FIG. 2 illustrates a configuration where each bit line BL and each complimentary bit line $\overline{BL}$ are individually coupled to a corresponding buffer amplifier 5a of the input/output circuit 5, the present invention is also applicable to the configuration shown in FIG. 3, where each bit line BL and each complimentary bit line $\overline{BL}$ are coupled to a common data line DB and a common data line $\overline{DB}$ via a switch YS which is turned on based on a selection made by the column decoder 4, the data lines DB and $\overline{DB}$ being coupled to one buffer amplifier 5a of the input/output circuit 5.

Figure 4:
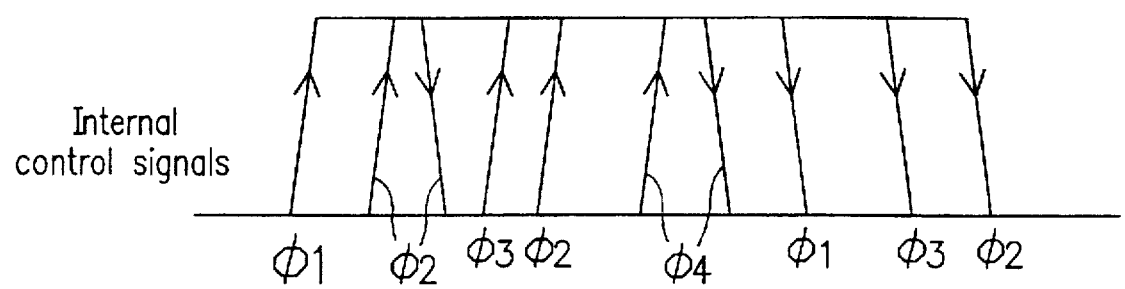
FIG. 4 is a timing diagram showing the transition of internal control signals during a read access.

Next, a read access for reading data from the memory cell MC, which is controlled in accordance with the internal control signals φ1 to φ7, is described with reference to FIG. 4. First, when the internal control signal φ1 becomes active, a word line WL selected by the row decoder 2 rises to the H level, so that the data stored in the memory cell MC is read to the bit line BL. At this time, the potential of the bit line BL is increased to slightly different values depending on whether data "1" or "0" is stored in the memory cell MC, i.e., depending on the polarization state of the ferroelectric film in the memory cell MC.

Then, the internal control signal φ2 becomes active and then inactive, so that the above-mentioned minute difference in potential of the bit line BL is sent to the sense amplifier SA. The sense amplifier SA is driven when the internal control signal φ3 becomes active to amplify the said minute difference in potential of the bit line BL, whereby data of the H level or the L level is obtained in accordance with the particular data stored in the memory cell MC. As the internal control signal φ2 becomes active again, the data which has been amplified by the sense amplifier SA is sent back to the bit line BL.

Then, since the word line WL is still at the H level, the data on the bit line BL is written to the memory cell MC. Such rewriting of data is required in this exemplary case, since the polarization state of the ferroelectric film is inverted when reading data "1" from the memory cell MC so as to destroy the stored data. Herein, the description of the control of the drive line DL is omitted.

After the data is amplified by the sense amplifier SA in the above-mentioned manner, the internal control signal φ4 becomes active and then inactive, during which period the data is transferred to the buffer sense amplifier 5a of the input/output circuit 5. Then, the buffer sense amplifier 5a inverts and outputs the data, which is sent to a reading circuit (not shown) so as to be output to the exterior of the memory device as read data DQ. Finally, the read access is completed as the internal control signals φ1, φ3, and φ2 become inactive in this order.

It is possible to omit the internal control signal φ2 and the switches S2 so that the bit line BL and the complimentary bit line $\overline{BL}$ are directly coupled to the sense amplifier SA. The same applies to the description below.

In a write access, the internal control signal φ7, instead of internal control signal φ4, is made active so that the data DQ externally input to the input/output circuit 5 is transferred to the bit line BL so as to be written to the memory cell MC.

As shown in FIG. 1, the above-described non-volatile semiconductor memory device includes a refresh control circuit 10. If a refresh mode signal φtr supplied from the main control circuit 9 becomes active and if the refresh control circuit 10 determines that a refresh operation is required, the refresh control circuit 10 makes the refresh start signal φta active and sends a row address and a column address for the refresh operation to the row decoder 2 and the column decoder 4 via the row selection circuit 7 and the column selection circuit 8, respectively. When the refresh start signal φta becomes active, the main control circuit 9 generates the internal control signals φ1 to φ7 for the refresh operation.

Thus, the refresh control circuit 10 is capable of separately refreshing individual memory cells MC of the memory cell array 1, the memory cell MC being selected in accordance with the above-mentioned row address and a column address for the refresh operation. Herein, the refresh operation includes the application of a positive electric field and a negative electric field for causing the polarization state of the ferroelectric film of the capacitor CS of the target memory cell MC to transit around the hysteresis curve by at least one complete round. As a result of the refresh operation, the spontaneous polarization of the ferroelectric film, which has deteriorated due to the application of only a positive or negative electric field being applied to the capacitor CS, can be restored.

Figure 5:
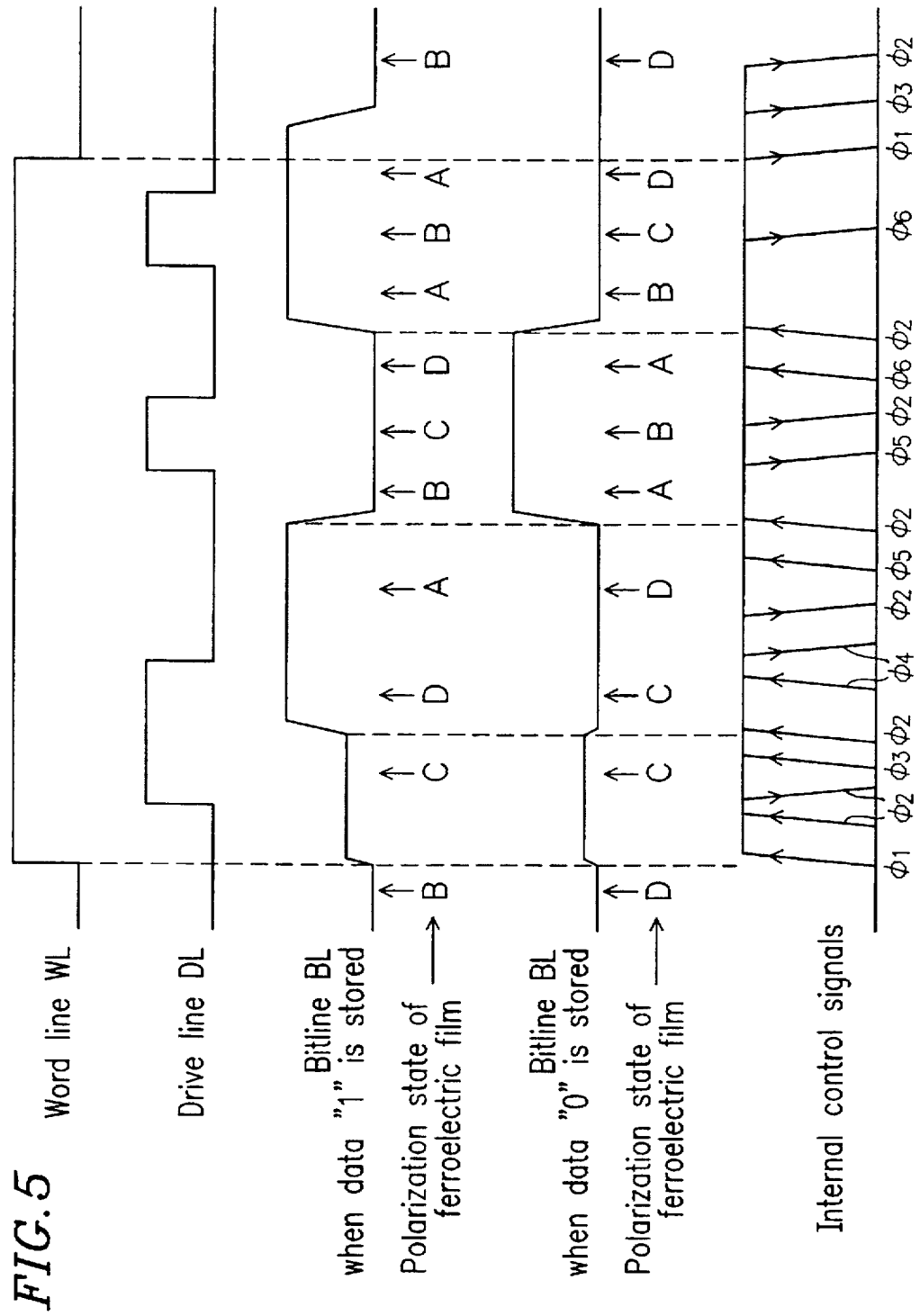
FIG. 5 is a timing diagram showing the transition of various signals during a refreshing operation.

The refresh operation in accordance with the internal control signals φ1 to φ7 is described with reference to FIG. 5. When the internal control signal φ1 becomes active, the word line WL selected by the row decoder 2 rises to the H level. The internal control signal φ2 becomes active and then inactive; then, the internal control signal φ3 becomes active; then, the internal control signal φ2 becomes active again; and the internal control signal φ4 becomes active and then inactive, as was described in the case of the read access. The drive line DL rises to the H level after the first activation of the internal control signal φ2 and falls to the L level as the internal control signal φ2 becomes active again.

Figure 18:
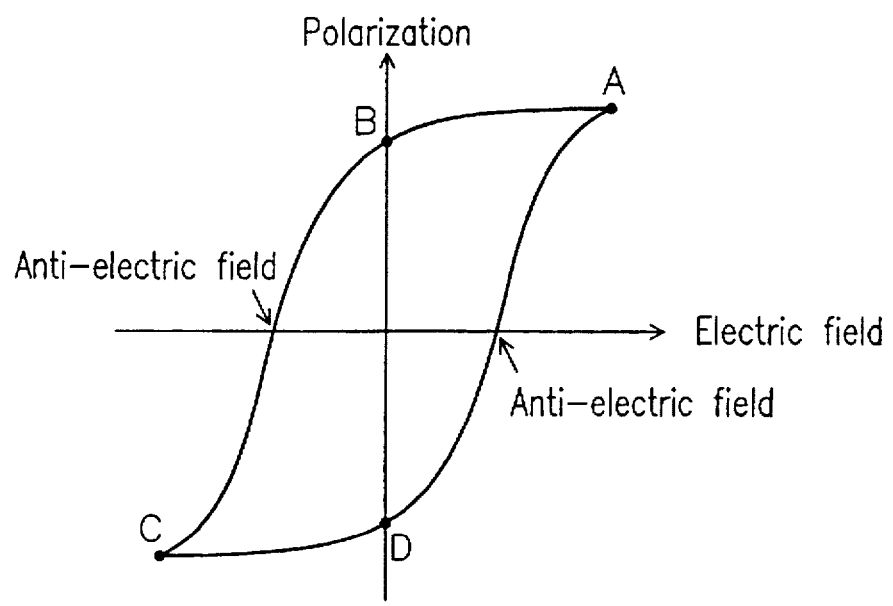
FIG. 18 is a graph showing a hysteresis curve of a ferroelectric film sandwiched in a capacitor of a memory cell.
Figure 19:
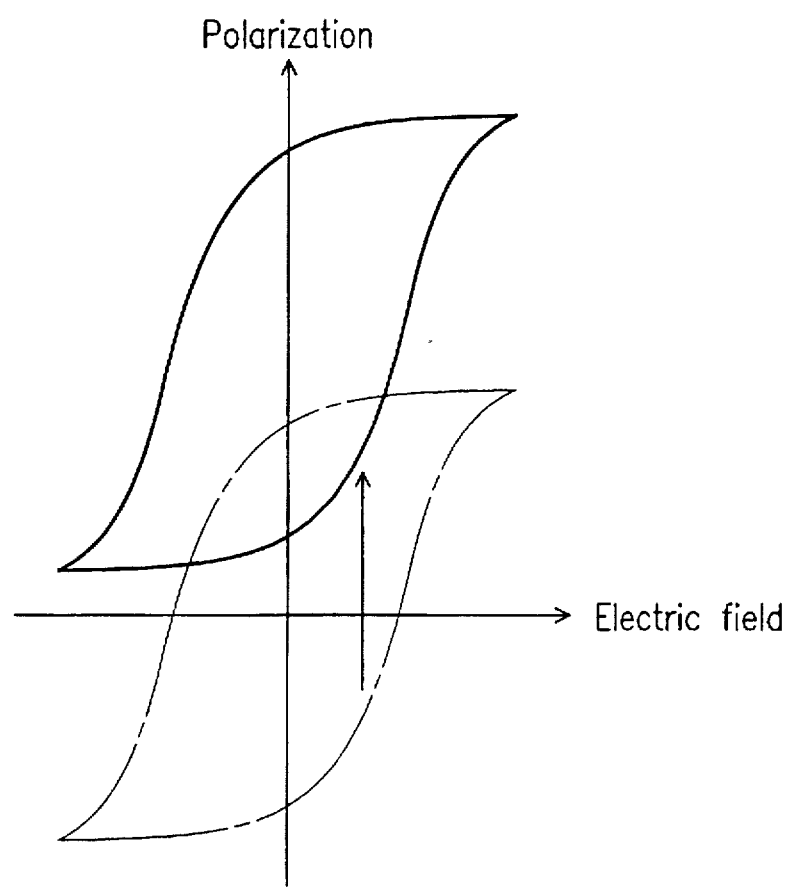
FIG. 19 is a graph illustrating a change in the hysteresis curve of a ferroelectric film sandwiched in a capacitor of a memory cell due to deterioration in the spontaneous polarization thereof.

Accordingly, in the case where data "1" is stored in the memory cell MC, the bit line BL (which was originally at the L level) is raised to a slightly high potential as the word line WL rises, and is further raised to the H level (as amplified by the sense amplifier SA) when the internal control signal φ2 becomes active again. As shown in FIG. 18, the polarization state of the ferroelectric film of the capacitor CS shifts from point B (indicating data "1") to point C as the drive line DL rises to the H level, thus being inverted. After the polarization state of the ferroelectric film shifts to point D responsive to the rise of the bit line BL to the H level, the polarization state shifts to point A responsive to fall of the drive line DL to the L level, i.e., inverted again, so that a rewriting is performed.

In the above case (where data "1" is stored in the memory cell MC), a complete round has been made around the hysteresis curve as the polarization state subsequently returns to point B. Therefore, the read access operation serves the function of a refresh operation. In other words, according to the present example, a substantial refresh operation is performed at the same time when a read access for reading data "1" occurs.

On the other hand, in the case where data "0" is stored in the memory cell MC, the bit line BL (which was originally at the L level) is raised to a potential which is slightly high but nonetheless lower than the potential reached in the case where data "1" is stored, and returns to the L level (as amplified by the sense amplifier SA) when the internal control signal φ2 becomes active again.

As shown in FIG. 18, the polarization state of the ferroelectric film of the capacitor CS in this case shifts from point D (indicating data "0") to point C as the drive line DL rises to the H level, and returns to point D as the drive line DL falls.

Furthermore, the H level data or the L level data as amplified by the sense amplifier SA is transferred to the buffer amplifier 5a of the input/output circuit 5 to be inverted and output.

When the internal control signal φ2 subsequently becomes temporarily inactive and the internal control signal φ5 becomes active, the data which has been inverted and output from the buffer amplifier 5a is returned, so that the logic level of the bit line BL is inverted when the internal control signal φ2 subsequently becomes active again. At this time, too, the drive line DL rises to the H level and then falls to the L level. The internal control signals φ5 and φ2 return to the L level after the inversion of the bit line BL.

Accordingly, in the case where data "1" has been stored in the memory cell MC, the bit line BL is inverted from the H level to the L level (as amplified by the sense amplifier SA). The polarization state of the ferroelectric film shifts from point A to point B responsive to the inversion of the bit line BL, and to point C responsive to the rise of the drive line DL, thus being inverted. The polarization state further shifts to point D as the drive line DL falls, so that the inverted data ("0") is written.

On the other hand, in the case where data "0" has been stored in the memory cell MC, the bit line BL is inverted from the L level to the H level (as amplified by the sense amplifier SA). The polarization state of the ferroelectric film shifts from point D to point A responsive to the inversion of the bit line BL, thus being inverted, and to point B responsive to the rise of the drive line DL. The polarization state further shifts to point A as the drive line DL falls, so that the inverted data ("1") is written.

When the internal control signal φ6 becomes active, the data which has been inverted and output from the buffer amplifier 5a is returned in a non-inverted state, so that the logic level of the bit line BL is inverted again when the internal control signal φ2 subsequently becomes active again, thereby restoring the original state. At this time, too, the drive line DL rises to the H level and then falls to the L level.

The internal control signal φ6 returns to the L level after the inversion of the bit line BL. Accordingly, in the case where data "1" has been stored in the memory cell MC, the bit line BL is inverted back to the H level. The polarization state of the ferroelectric film shifts from point D to point A responsive to the inversion of the bit line BL, thus being inverted, and to point B responsive to the rise of the drive line DL. The polarization state further shifts to point A as the drive line DL falls, so that the original non-inverted data ("1") is rewritten.

On the other hand, in the case where data "0" has been stored in the memory cell MC, the bit line BL is inverted back to the L level. The polarization state of the ferroelectric film shifts from point A to point B responsive to the inversion of the bit line BL, and to point C responsive to the rise of the drive line DL, thus being inverted. The polarization state further shifts to point D as the drive line DL falls, so that the original non-inverted data ("0") is rewritten.

The refresh operation is completed as the internal control signals φ1, φ3, and φ2 become inactive in this order. In the case where data "1" has been stored, the polarization state returns to point B as the bit line BL returns to the L level. As a result of this refresh operation, the polarization state of the ferroelectric film transits around the hysteresis curve by two complete rounds in the case where data "1" has been stored, and one complete round in the case where data "0" has been stored. It should be noted that the original data, whether "1" or "0", is conserved. Accordingly, there is no need to save the data in another memory cell during the refresh operation.

In the exemplary circuit shown in FIG. 2, each bit line BL is coupled to a buffer amplifier 5a so that it is possible to perform a simultaneous refresh operation for a number of memory cells MC coupled to a number of bit lines BL, if necessary. In the exemplary circuit shown in FIG. 3, each memory cell MC coupled to a corresponding bit line BL will be individually refreshed while sequentially turning on the respective switches YS with the row decoders 4.

As shown in FIG. 1, the refresh control circuit 10 receives a column address and a row address via the address buffer 6 and data DQ which is input or output via the input/output circuit 5, while receiving a read pulse φr, notifying that a read access is to be made, and a write pulse φw, notifying that a write access is to be made, from the main control circuit 9.

Figure 6:
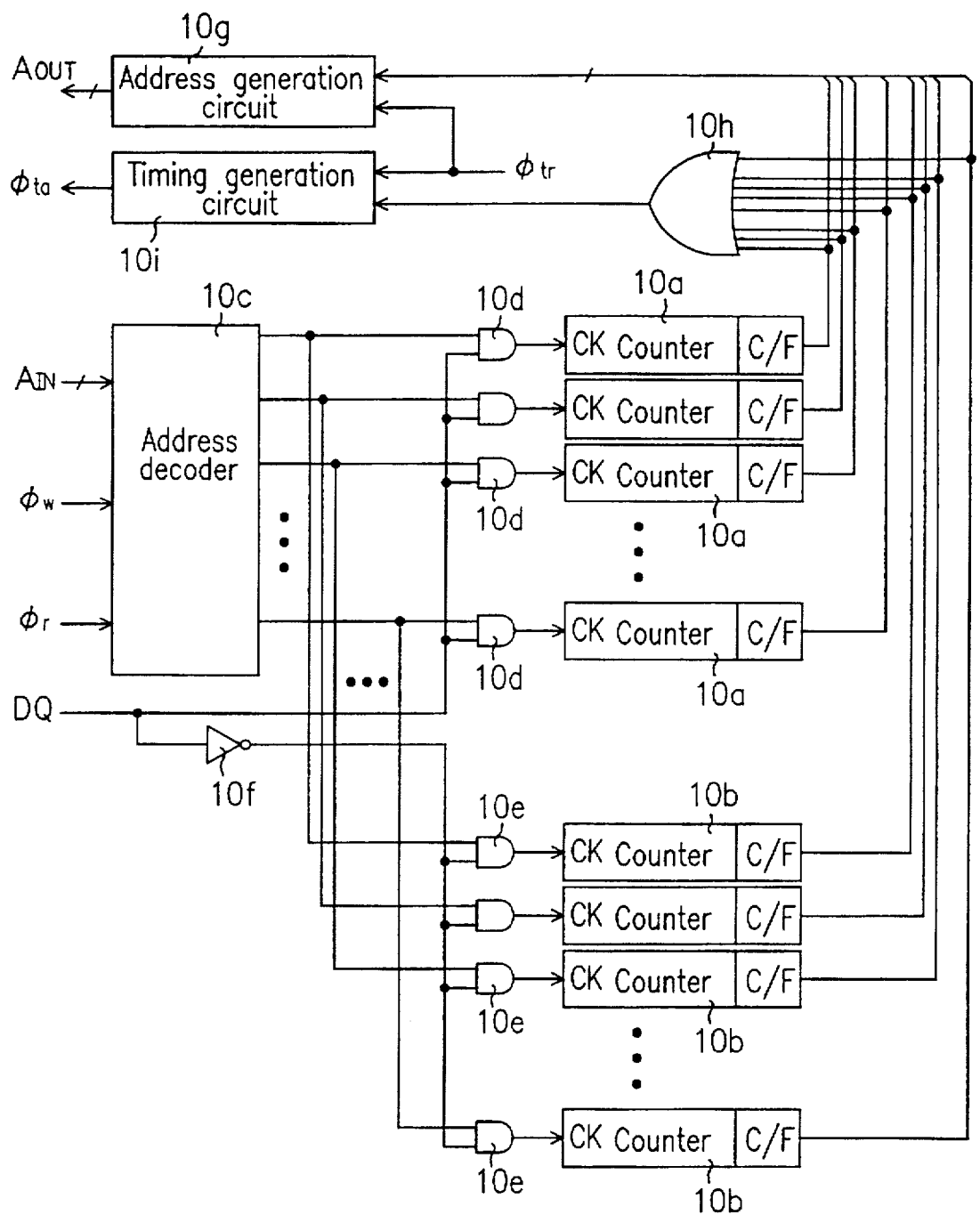
FIG. 6 is a block diagram illustrating an exemplary configuration of a refresh control circuit according to Example 1 of the present invention.

As shown in FIG. 6, the refresh control circuit 10 includes first counters 10a ... and second counters 10b ... both corresponding to the respective memory cells MC of the memory cell array 1.

The first counters 10a ... and second counters 10b ... can be ordinary counters which latch counted values to volatile flip-flop circuits. Alternatively, the counted values may be stored in a non-volatile manner in dedicated portions, e.g., memory cells MC, of the memory cell array 1.

The row address and the column address are input to the address decoder 10c as an address $A_{IN}$. The address decoder 10c also receives the read pulse φr and the write pulse φw. The address decoder 10c decodes the address $A_{IN}$ to set one of the decoding outputs to the H level when the read pulse φr or the write pulse φw becomes active.

Each decoding output of the address decoder 10c is input to the clock input CK of a corresponding first counter 10a via an AND circuit 10d, and to the clock input CK of a corresponding second counter 10b via an AND circuit 10e. The other input of each AND circuit 10d receives the data DQ. The other input of each AND circuit 10e receives a signal obtained by inverting the data DQ at an inverter 10f.

Therefore, when a read access or a write access is made, one of the decoding outputs of the address decoder 10c rises to the H level. When the data DQ is at the H level, a pulse is supplied to the clock input CK of the corresponding first counter 10a via the corresponding AND circuit 10d. When the data DQ is at the L level, a pulse is supplied to the clock input CK of the corresponding second counter 10b via the corresponding AND circuit 10e.

The first counters 10a ... and second counters 10b ... perform counting in accordance with pulses received at their clock inputs CK. When the counted value reaches a predetermined value, a carry flag C/F is set to the H level. The values of the carry flag C/F in the first counters 10a and second counters 10b are collectively sent to an address generation circuit 10g. Moreover, the values of the carry flag C/F in the first counters 10a and second counters 10b are sent to a multiple-input OR circuit 10h to be subjected to a logic OR operation, the result of which is sent to a timing generation circuit 10i.

The address generation circuit 10g is an encoder which outputs the address $A_{out}$ of a memory cell MC corresponding to the first counter 10a or the second counter 10b whose carry flag C/F has risen to the H level. The address $A_{out}$ is divided into a row address and a column address for a refreshing operation so as to be sent to the row selection circuit 7 and the column selection circuit 8, respectively, shown in FIG. 1. The timing generation circuit 10i makes the refresh start signal φta active (sent to the main control circuit 9) when a carry flag C/F rises to the H level. The address generation circuit 10g and the timing generation circuit 10i output the address $A_{OUT}$ and make the refresh start signal φta active only when the refresh mode signal φtr supplied from the main control circuit 9 is active.

In the refresh control circuit 10 having the above-described configuration, when a read access or a write access is made to the non-volatile semiconductor memory device, the first counter 10a corresponding to the accessed memory cell MC counts in the case where the data DQ which has been read or written during the access is at the H level, and the second counter 10b corresponding to the accessed memory cell MC counts in the case where the data DQ is at the L level.

When the refresh mode signal φtr is made active by external control or through an automatic response of the main control circuit 9, if the carry flag C/F of a first counter 10a or a second counter 10b is set, the refresh control circuit 10 makes the refresh start signal φta active and outputs the address $A_{out}$ of a memory cell MC corresponding to the first counter 10a or the second counter 10b whose carry flag C/F is set.

Then, responsive to the activation of the refresh start signal φta, the main control circuit 9 generates internal control signals φ1 to φ7 for a refresh operation, so that the above-described refresh operation is performed for the memory cell MC selected in accordance with the address $A_{OUT}$. Therefore, in the case where read or write accesses for either data "0" or data "1" are repeated to a particular memory cell MC, only that memory cell MC can be refreshed. As a result, redundant refresh operations for the memory cells which do not need refreshing can be prevented, and the amount of time required for refresh operations can be reduced.

Furthermore, assuming that the data DQ rises to the H level when data "1" is stored in the memory cell MC, a carry flag C/F is set in a first counter 10a when the last read or write access for data "1" is performed for the corresponding memory cell MC. At this time, the memory cell MC is storing data "1". Therefore, a refreshing effect is attained simply by performing the above-described read access. By differentiating the control for the refresh operation between the first counter 10a and the second counter 10b, the amount of time required for refreshing operations can be further reduced.

Herein, it is assumed that the first counters 10a and the second counters 10b have their carry flags C/F reset each time when a refresh operation has been performed for their corresponding memory cells MC.

The circuit shown in FIG. 6 includes no special means for dealing with a situation where the carry flags C/F of a plurality of first counters 10a or second counters 10b are set when the refresh mode signal φtr becomes active. However, such situations can be dealt with by sequentially refreshing the memory cells MC corresponding to the first counters 10a or second counters 10b by sequentially outputting the addresses $A_{OUT}$ of the corresponding memory cells MC.

As described above, a read access for reading data "1" from a memory cell MC has a refreshing effect. However, access counters employed in conventional FRAMs are indifferent to the kind of accesses they count. Therefore, even when the above-mentioned read access having a refresh effect was made to a memory cell, the counter would count the address, thereby increasing the probability of the memory cell receiving a refresh operation later. Therefore, the increased number of memory cells included in one block (as necessitated by increased capacities) of conventional FRAMs simply increases the time required for refreshing, while being unable to eliminate the redundant refreshing performed for memory cells to which such accesses were made. Hence, conventional FRAMs were unable to prevent decrease in accessing efficiency.

Figure 7:
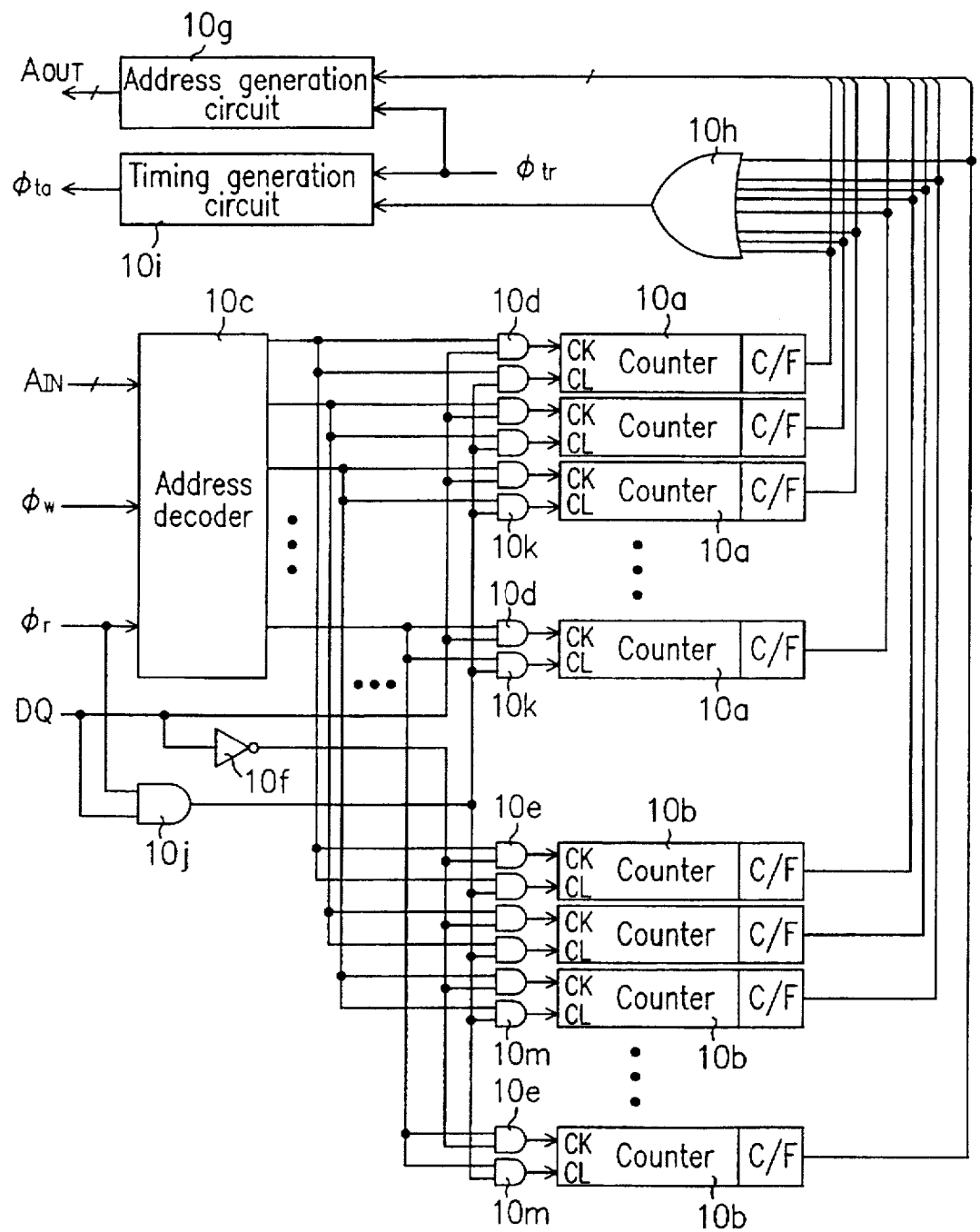
FIG. 7 is a block diagram illustrating another exemplary configuration of a refresh control circuit according to Example 1 of the present invention.

The inventors of the present invention took note of the read access for reading data "1" from a memory cell MC having a refreshing effect. Hence a variant of the refresh control circuit 10 for the non-volatile semiconductor memory device is shown in FIG. 7, where the first counter 10a and the second counter 10b corresponding to a memory cell MC to which a read access for reading data "1" has been made are cleared so as to bring back the counted values thereof to their initial values. Specifically, in FIG. 7, an AND circuit 10j detects that the read pulse $\phi r$ is active with the data DQ being at the H level (data "1"), in which case a pulse is sent to the clear inputs CL of the corresponding first counter 10a and the second counter 10b so as to set the counted values thereof back to their initial values.

Thus, in the case where a read access for reading data "1" is made to an memory cell MC, refreshing for the memory cell MC can be omitted, thereby further reducing the redundancy of refresh operations. Alternatively, the refresh control circuit 10 can be configured so that, when a read access for reading data "1" is made, the first counter 10a ignores, i.e., does not count, such an access, instead of clearing the values counted by the first counter 10a and the second counter 10b.

Figure 8:
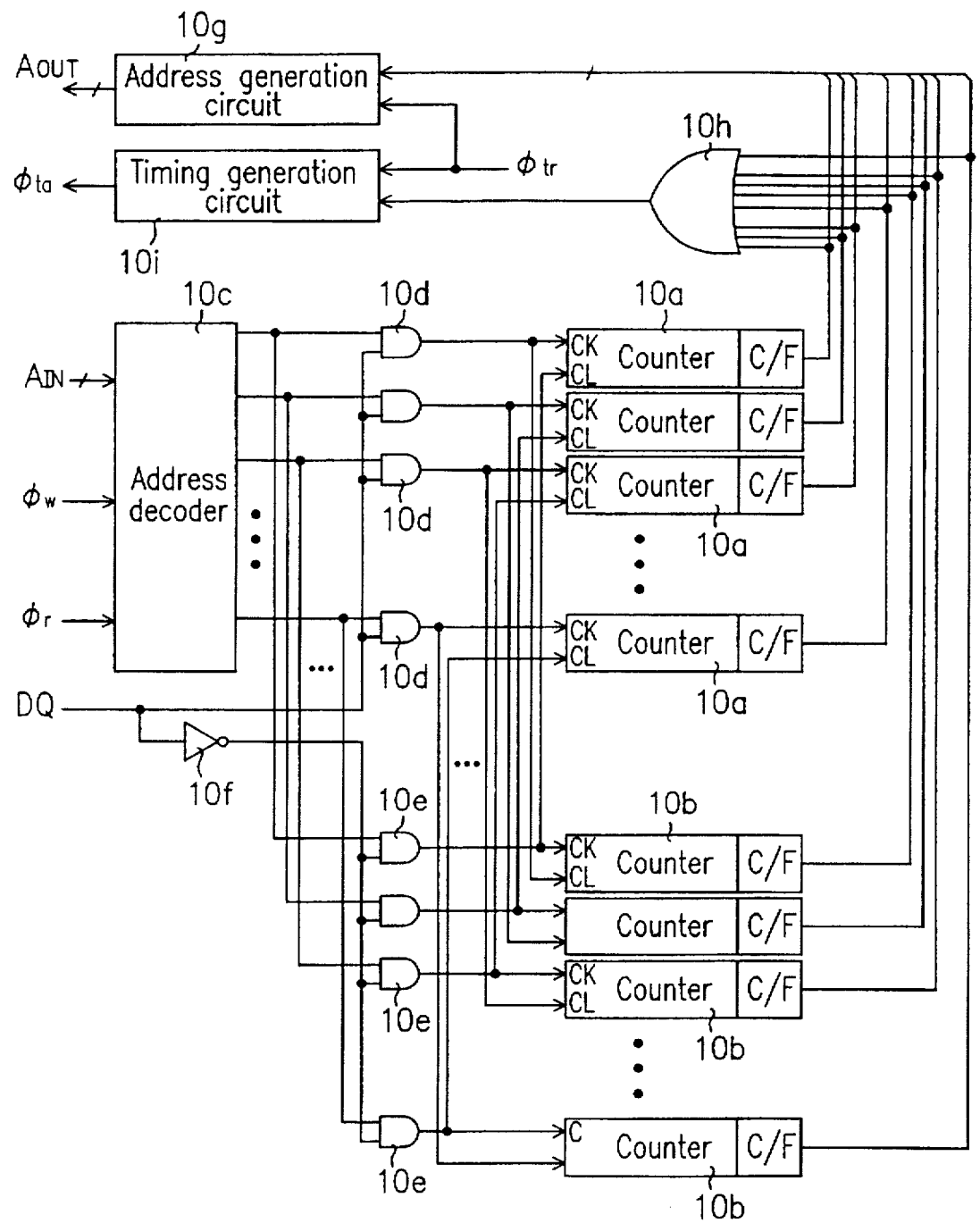
FIG. 8 is a block diagram illustrating still another exemplary configuration of a refresh control circuit according to Example 1 of the present invention.

Similarly, when accesses for data "1" and data "0" are alternately made to a particular memory cell MC, both positive and negative electric fields are applied to the ferroelectric film of the capacitor CS, thereby providing a refreshing effect. Therefore, the refresh control circuit 10 can be configured so that, as shown in FIG. 8, the first counter 10a or the second counter 10b only counts consecutive addresses for either data "1" or "0" are made to a given memory cell MC.

Specifically, the refresh control circuit 10 can be configured so that, when a pulse is supplied to the clock input CK for the first counter 10a or the second counter 10b, a pulse is also supplied to the clock input CK for the other counter (i.e., the second counter 10b or the first counter 10a) corresponding to the same memory cell MC so as to set the counted value of the other counter to its initial value. As a result, when accesses for data "1" and data "0" are alternately made, both the first counter 10a and the second counter 10b are cleared so that the refreshing for the memory cell MC is omitted, thereby further reducing the redundancy of refresh operations.

As described above, in accordance with the non-volatile semiconductor memory device of the present example, the number of addresses made to each memory cell MC for data "1" or "0" is counted, whereby minimum refreshing can be performed on the basis of each memory cell MC. Thus, the decrease in access efficiency is prevented.

FIGS. 9 to 16 are diagrams showing a non-volatile semiconductor memory device according to Example 2 of the present invention. The component elements in FIGS. 9 to 16 that also, appear in FIGS. 1 to 8 are indicated by the same reference numerals as used therein, their descriptions being omitted.

The present example illustrates a non-volatile semiconductor memory device including counters for counting the number of accesses made to each of a plurality of blocks (along the row direction and the column direction) into which a memory cell array 1 is divided. The memory cell array 1, a group of sense amplifiers 3, an input/output circuit 5, an address buffer 6, and a main control circuit 9 can be configured as those in Example 1.

Herein, the memory cell array 1 includes a matrix of $2^{(n1+n2)}$ memory cells MC (consisting of $2^{n1}$ rows×$2^{n2}$ columns). The address buffer 6 divides an externally-supplied address A into an $n_1$-bit row address and an $n_2$-bit row address.

Among the $n_1$ bits of the row address, $m_1$ bits are sent to a row predecoder 11, and the other ($n_1$ bits–$m_1$ bits) are sent to $2^{m1}$ row sub decoders 12 . . . . Among the $n_2$ bits of the row address, $m_2$ bits are sent to a column predecoder 13, and the other ($n_2$ bits–$m_2$ bits) are sent to $2^{m1}$ column sub decoders 14 . . . . The decoders 11 to 14 are circuits for decoding input addresses.

Figure 10:
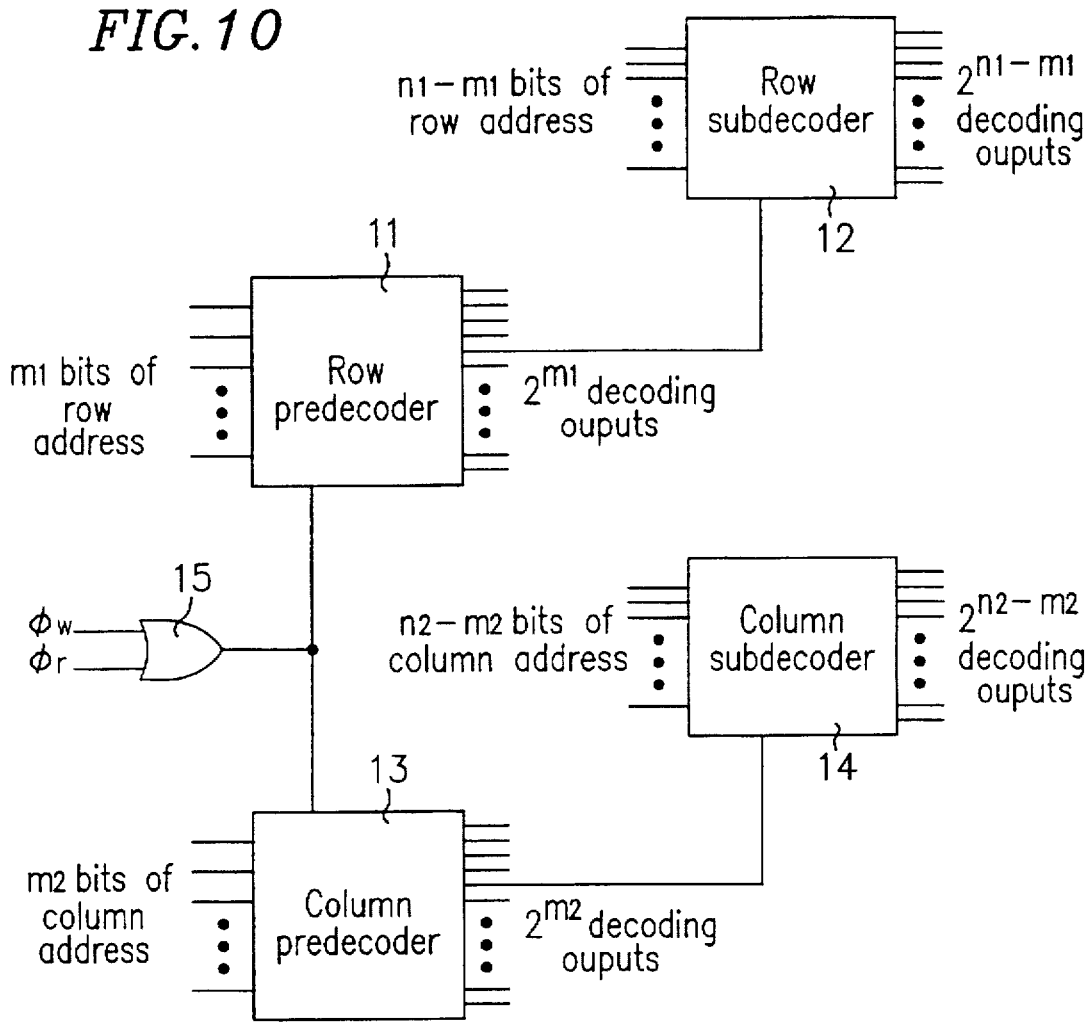
FIG. 10 is a block diagram illustrating an exemplary interconnection between predecoders and subdecoders according to Example 2 of the present invention.

As shown in FIG. 10, the row predecoder 11 and the column predecoder 13 perform decoding only when a read pulse $\phi r$ or a write pulse $\phi w$ is active, which are input via an OR circuit 15. Each row subdecoder 12 is provided for each decoding output of the row predecoder 11 so as to perform decoding only when the corresponding decoding output is active. Each column subdecoder 14 is provided for each decoding output of the column predecoder 13 so as to perform decoding only when the corresponding decoding output is active.

Figure 11:
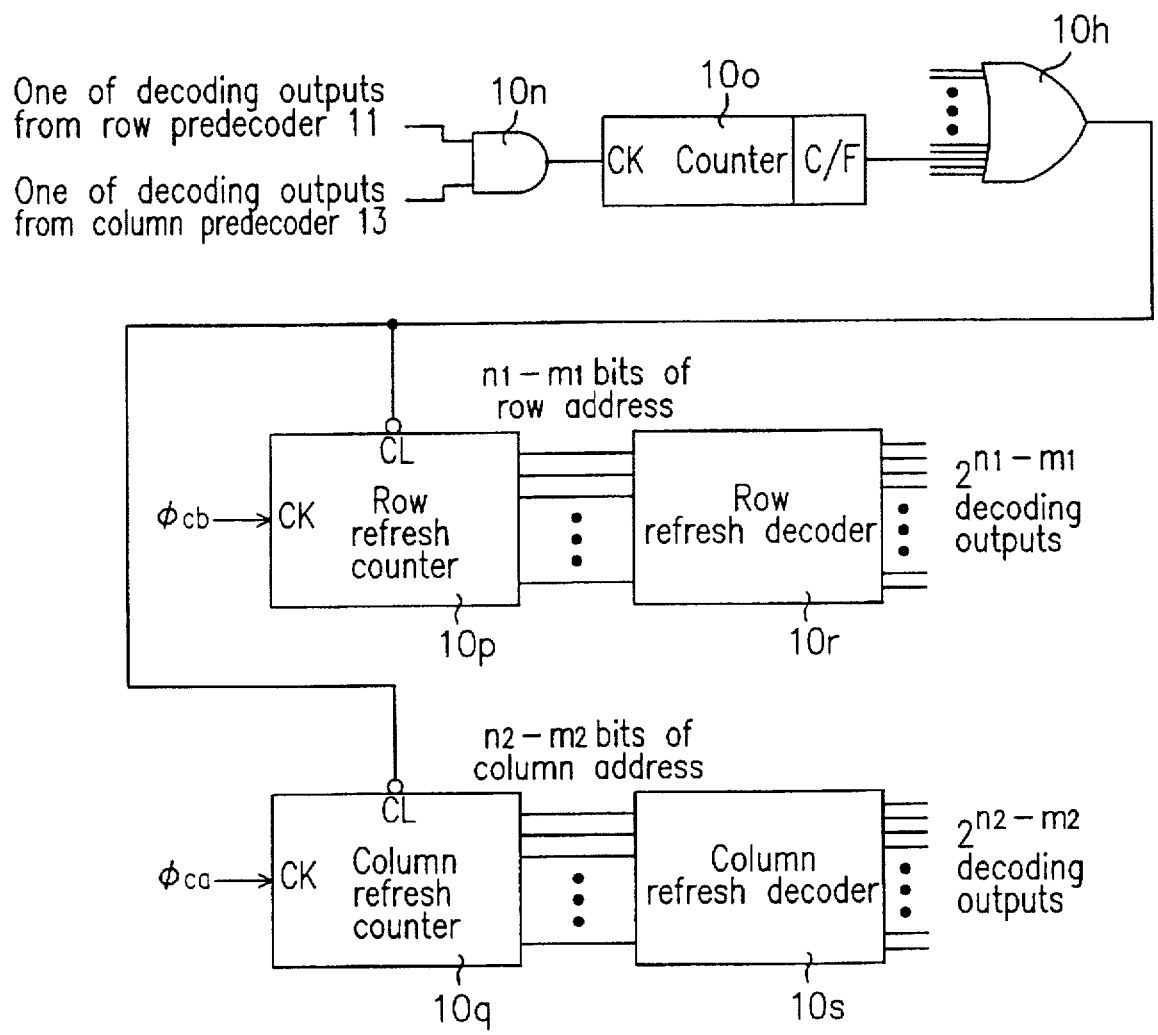
FIG. 11 is a block diagram illustrating an exemplary configuration of a refresh control circuit according to Example 2 of the present invention.

A refresh control circuit 10 receives decoding outputs which have been predecoded by the row predecoder 11 and the column predecoder 13. As shown in FIG. 11, a pair consisting of one of the decoding outputs of the row predecoder 11 and one of the decoding outputs of the column predecoder 13 is supplied to a clock input CK of a corresponding counter 10o via an AND circuit 10n.

Therefore, there are a number $2^{(m1+m2)}$ of counters 10o, as opposed to the $2^{(n1+n2)}$ counters provided in Example 1 (where one counter corresponds to each memory cell MC). Thus, one counter 10o is provided for each of the $2^{(m1+m2)}$ blocks obtained by dividing the memory cell array 1 into $2^{m1}$ blocks along the row direction and $2^{m2}$ blocks along the column direction. The number $2^{(m1+m2)}$ is prescribed to be sufficiently smaller than $2^{(n1+n2)}$.

The values of carry flags C/F of all the counters 10o are subjected to a logic OR operation at a multiple-input OR circuit 10h, which generates an output that takes the H level whenever any of the carry flags C/F is set.

Figure 12:
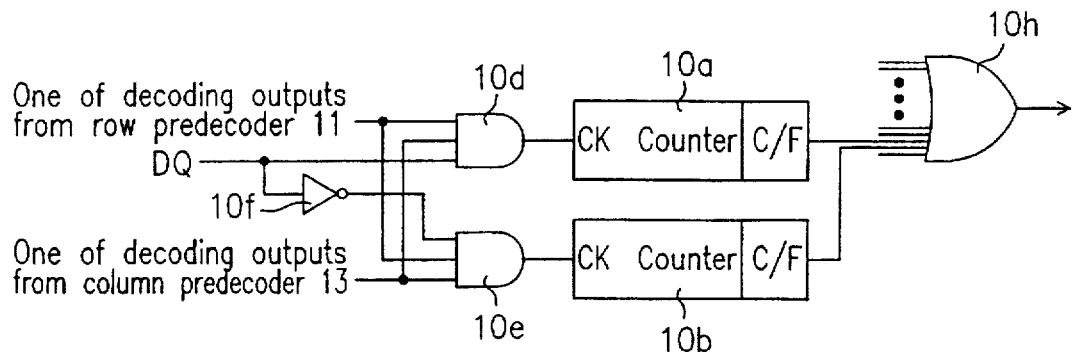
FIG. 12 is a block diagram illustrating another exemplary configuration of a refresh control circuit according to Example 2 of the present invention.

Although the counters 10o counts accessed data DQ indifferently to the kinds of data DQ in this example, it is also possible to, as in Example 1 provide a group of first counters 10a and a group of second counters 10b for each counting data DQ of data "1" or "0", respectively (or vice versa), thereby reducing the redundancy of refresh operations (as shown in FIG. 12).

However, even if a read access for reading data "1" is performed or if accesses for data "1" and data "0" are alternately made in the present example, it is inappropriate to clear the counted values or stop counting for such accesses in the manner described in Example 1. The reason is that, even if such access having a refreshing effect has been made to a memory cell MC in a block so that the memory cell MC does not need refreshing, the other memory cells MC in the same block usually still need refreshing.

As shown in FIG. 11, the output of the multiple-input OR circuit 10h is input to a clear input $\overline{CL}$ of a row refresh counter 10p and a clear input $\overline{CL}$ of a column refresh counter 10q. The row refresh counter 10p starts counting the clock signal φcb as the output of the multiple-input OR circuit 10h rises to the H level so as to output a row address of $(n_1-m_1)$ bits. A row refresh decoder 10r decodes the $(n_1-m_1)$-bit row address so as to output a number $2^{(n1-m1)}$ of decoding outputs.

The column refresh counter 10q starts counting the clock signal φca as the output of the multiple-input OR circuit 10h rises to the H level so as to output a column address of $(n_2-m_2)$ bits. A column refresh decoder 10s decodes the $(n_2-m_2)$-bit column address so as to output a number $2^{(n2-m2)}$ of decoding outputs.

Figure 13:
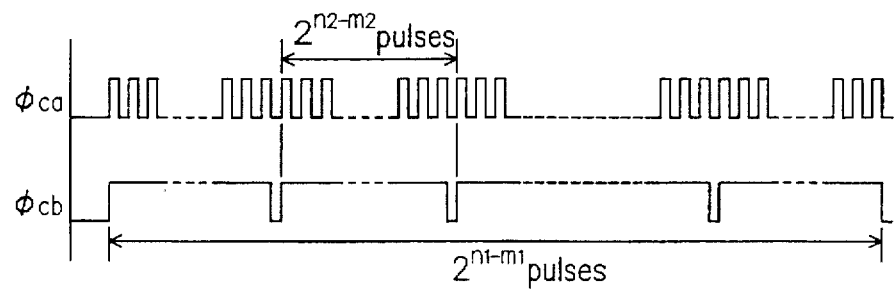
FIG. 13 is a timing diagram showing a clock signal for a refresh operation according to Example 2 of the present invention.
Figure 14:
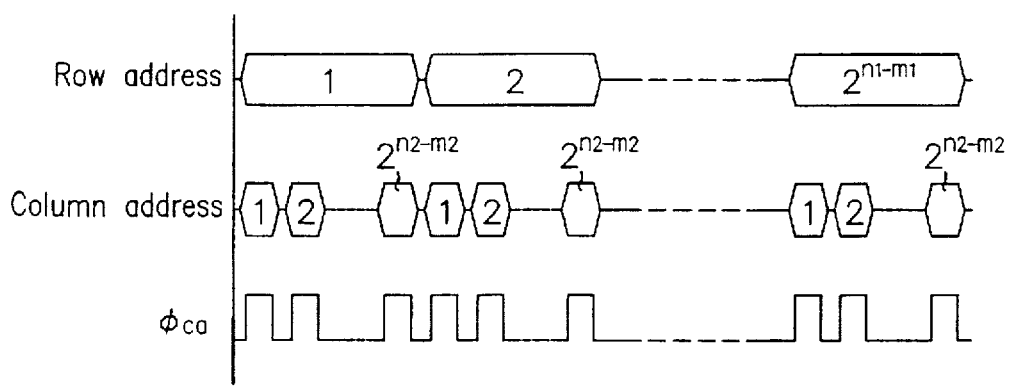
FIG. 14 is a timing diagram showing a row address and a column address for a refresh operation according to Example 2 of the present invention.

As shown in FIG. 13, the clock signal φcb is a pulse sequence obtained by dividing a pulse sequence of the clock signal φca by $2^{(n2-m2)}$. Therefore, as shown in FIG. 14, when the output of the multiple-input OR circuit 10h rises to the H level, the column address changes corresponding to every pulse of the clock signal φca, making a complete round after $2^{(n2-m2)}$ changes; and the row address changes corresponding to every $2^{(n2-m2)}$ pulses of the clock signal φca, making a complete round after $2^{(n1-m1)}$ changes.

Figure 9:
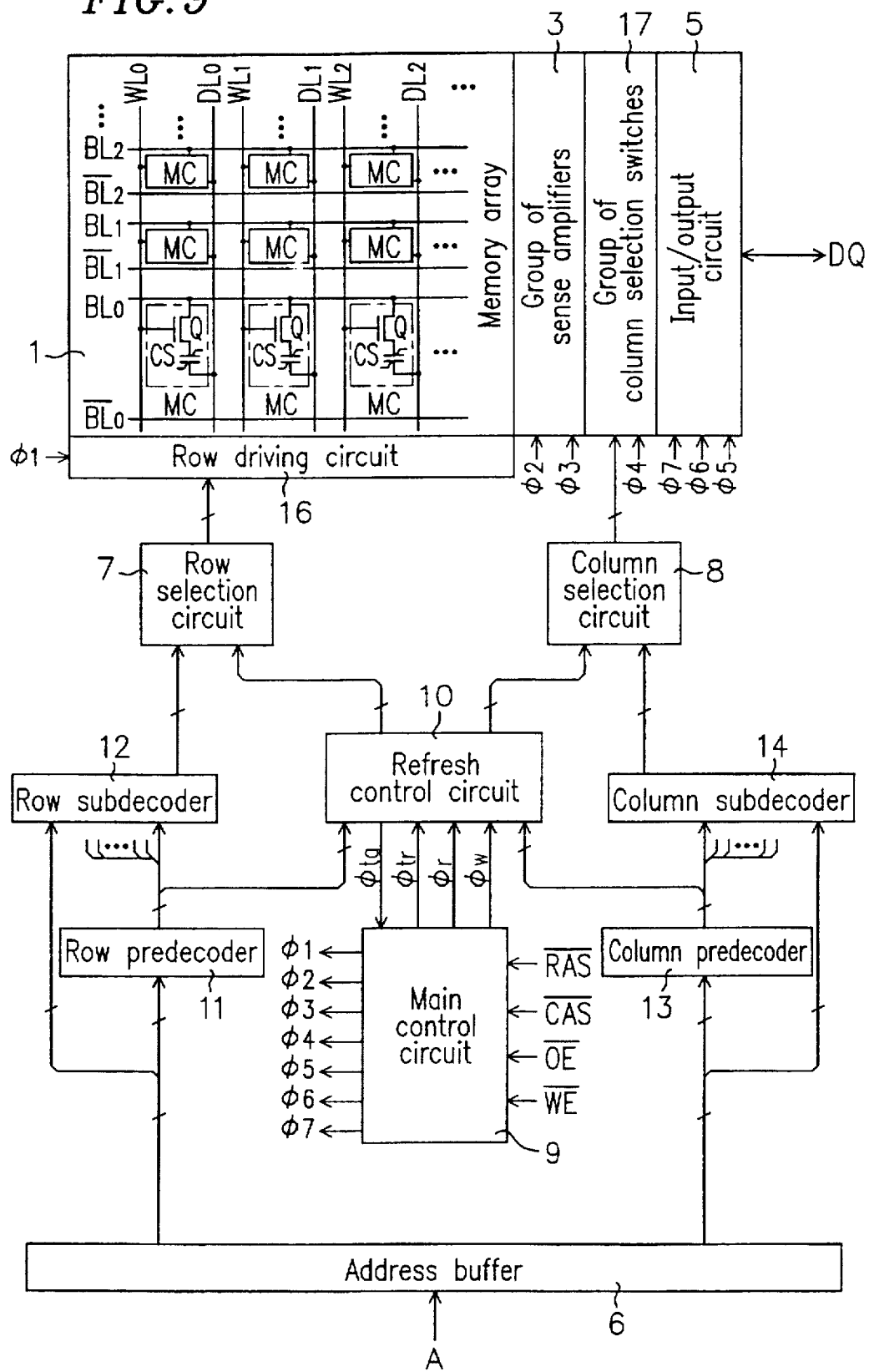
FIG. 9 is a block diagram illustrating an exemplary configuration of a non-volatile semiconductor memory device according to Example 2 of the present invention.

As shown in FIG. 9, each of the decoding outputs (for row addresses) of the row refresh decoder 10r is output from the refresh control circuit 10 so as to be sent to a row driving circuit 16 via a corresponding row selection circuit 7 along with the corresponding decoding output of the row subdecoder 12.

Each of the decoding outputs (for column addresses) of the column refresh decoder 10s is output from the refresh control circuit 10 so as to be sent to a group of column selection switches 17 via a corresponding column selection circuit 8 along with the corresponding decoding output of the column subdecoder 14. The row driving circuit 16 includes portions of the driving circuitry of the row decoder 2 of Example 1 excluding the decoding section thereof. The group of column selection switches 17 includes portions of the switching circuitry of the column decoder 4 of Example 1 excluding the decoding section thereof. As in Example 1, each row selection circuit 7 or each column selection circuit 8 converts inputs in two directions into an output in one direction. One row selection circuit 7 is provided corresponding to each row subdecoder 12 for processing an address decoding output. One column selection circuit 8 is provided corresponding to each column subdecoder 14 for processing an address decoding output.

Figure 15:
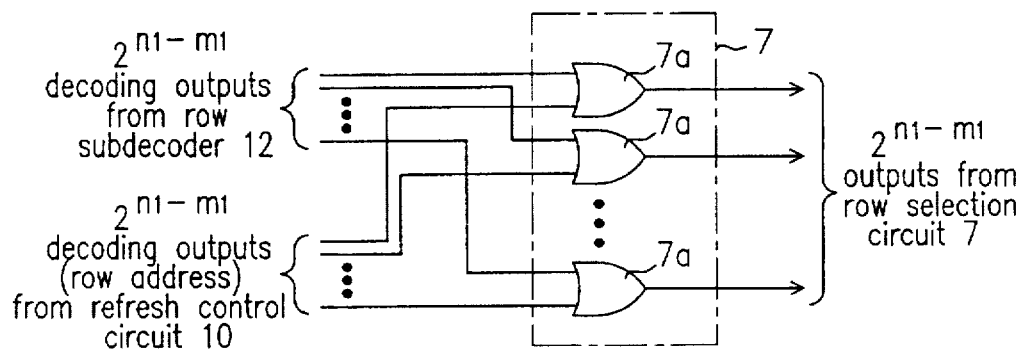
FIG. 15 is a block diagram illustrating an exemplary configuration of a row selection circuit according to Example 2 of the present invention.
Figure 16:
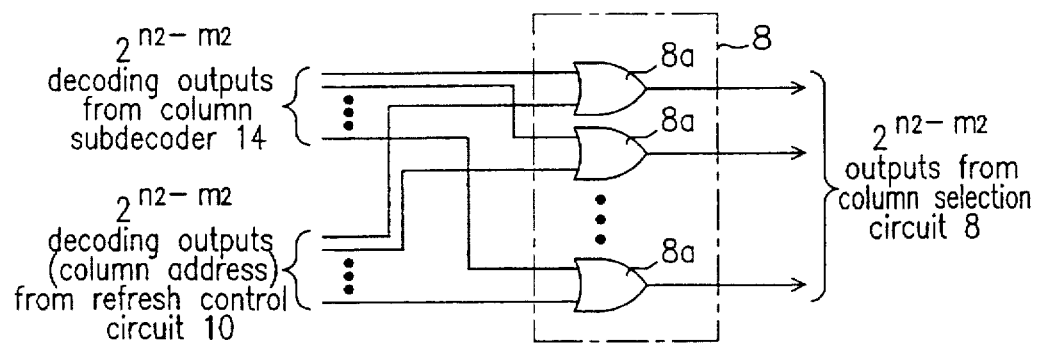
FIG. 16 is a block diagram illustrating an exemplary configuration of a column selection circuit according to Example 2 of the present invention.

Specifically, as shown in FIG. 15, each row selection circuit 7 couples each decoding output (for a row address) of the refresh control circuit 10 and the decoding output of each row subdecoder 12 to both inputs of a corresponding one of the $2^{(n1-m1)}$ OR circuits 7a .... The outputs of the OR circuits 7a ... are sent to the row driving circuit 16. As shown in FIG. 16, the column selection circuit 8 couples, each decoding output (for a column address) of the refresh control circuit 10 and the decoding output of each column subdecoder 14 to both inputs of a corresponding one of the $2^{(n2-m2)}$ OR circuits 8a .... The outputs of the OR circuits 8a ... are sent to the group of column selection switches 17. A circuit not shown selects the row selection circuit 7 and the column selection circuit 8 which actually receive decoding outputs from the refresh control circuit 10 based on the pair of decoding outputs from the row predecoder 11 and the column predecoder 13 corresponding to the counter 10o whose carry flag C/F is set.

In accordance with the above-described configuration, when the output of the multiple-input OR circuit 10h rises to the H level, the decoding outputs for the row address and the column address are sent to the memory cell array 1 from the row refresh decoder 10r and the column refresh decoder 10s, via the row selection circuit 7 and the column selection circuit 8 that selected a block which the counter 10o corresponds to. Then, a refresh operation is performed for the $2^{(n1-m1-n2-m2)}$ memory cells MC included in the block corresponding to the counter 10o whose carry flag C/F is set.

Therefore, although there is admitted redundancy in the refresh operation for the memory cells MC which simultaneously receive the refresh operation with the one memory cell MC which actually needs refreshing, (as opposed to the memory cell-based refreshing according to Example 1), the block-based refreshing operation according to Example 2 of the invention (where the blocks are further divided along the row direction and the column direction) substantially reduces the redundant refresh operations which would inevitably be performed in conventional non-volatile semiconductor memory devices (where refreshing is performed on the basis of every word line WL or every drive line DL), especially in the case of large-capacity memory devices. Furthermore, the refresh operation according to Example 2 also reduces the amount of time required for refresh operations. As a result, the decrease in access efficiency is prevented.

In the case where each bit line BL in the memory cell array 1 is coupled to a separate buffer amplifier 5a as in Example 1 illustrated with reference to FIG. 2, it is possible to simultaneously refresh all the $2^{(n2-m2)}$ memory cells MC in all the columns by turning on all the switches YS within the pertinent block. Thus, all the memory cells MC in one block can be refreshed through $2^{(n1-m1)}$ refresh operations.

As described above, in accordance with the non-volatile semiconductor memory device of the present invention, a refresh operation is performed by determining the deterioration of the spontaneous polarization of the ferroelectric film of each memory cell, based on counting the number of accesses made to each memory cell. Thus, each memory cell can be securely perverted from deterioration. Since each memory cell is subjected to the determination as to whether or not it needs refreshing so that only the memory cells which truly need refreshing are subjected to refreshing on a memory cell basis, the decrease in access efficiency is prevented.

Moreover, in the case where the polarization state of the ferroelectric film is inverted when first logic data (i.e., "1" or "0") is read from a memory cell, a complete round on the hysteresis curve of the polarization state of the ferroelectric film is attained by performing a read access for reading the first logic data and a subsequent write access for rewriting the data, thereby providing a refreshing effect. Therefore, the counting of the first counter can be controlled in such cases so as to further reduce the redundancy of refresh operations.

Moreover, by resetting the first counter when an access having a refreshing effect has been made so as to start counting all over from the beginning, the redundancy of refresh operations can be further reduced.

Moreover, when the value counted by the second counter has exceeded a predetermined value, write operations for writing inverted data and non-inverted data can be performed for the pertinent memory cell so as to achieve a complete round on the hysteresis curve of the polarization state of the ferroelectric film, thereby performing a refreshing. Therefore, a refresh operation can be performed without temporarily saving the data stored in the pertinent memory cell in a separate place, e.g., a memory cell. If the value counted by a first counter has exceeded a predetermined value, a refresh operation can be performed by performing one or more read accesses for the memory cell corresponding to the first counter.

In the above case, since a read access for reading the first logic data is either skipped from counting or causes the first counter to be reset, the first counter counts only the number of write accesses for writing the first logic data. The first logic data can be read by performing a read access from this memory cell, thereby attaining a refreshing effect as described above. Consequently, in this case of distinguishing the write access for writing the first logic data from accesses for reading or writing the second logic data, not only is there no need to temporarily save the data stored in the pertinent memory cell, but also the amount of time required for refreshing can be reduced when a write access for writing the first logic data has necessitated a refreshing.

Furthermore, in accordance with the non-volatile semiconductor memory device of the present invention, all the memory cells are divided into $2^{(m1+n2)}$ blocks so that refresh operations can be performed based on the counted number of accesses made to each block. While admitting the relative redundancy (as compared to the above-mentioned memory cell-based refreshing) in the refresh operation for the memory cells simultaneously receiving a refresh operation for the sake of one memory cell in the same block which actually needs refreshing, there is provided an advantage of a smaller number of counters (i.e., as many counters as there are blocks) being required.

Moreover, as compared to the conventional method of refreshing all the memory cells, the refreshing according to one embodiment of the present invention reduces the amount of time required for refreshing to that which is required for only the memory cells in the relevant block (i.e., one block). Therefore, the decrease in access efficiency is prevented. Moreover, each block can be selected by predecoding a row address of $m_1$ bits and a column address of $m_2$ bits, that is, the blocks can be further divided as compared to the conventional refreshing methods which are performed on a word or drive line basis. Thus, the redundancy in refresh operations due to refreshing the still-viable memory cells within the same block, while the amount of time required for each refreshing can be reduced.

Furthermore, the accesses to the memory cells in one block can be separately counted, depending on whether the accesses are intended for the first logic data or the second logic data.

Furthermore, by using a column refresh counter for column addresses of $(n_2-m_2)$ bits and a row refresh counter for row addresses of $(n_1-m_1)$ bits, it is possible to sequentially generate the addresses for all the memory cells within the block automatically at the time of a refresh operation.

Thus, in accordance with one embodiment of the non-volatile semiconductor memory device of the present invention, refresh operations are performed by counting the number of accesses made to each memory cell without redundancy. Since each memory cell is subjected to the determination as to whether or not it needs a refreshing, only the memory cells which truly need refreshing are subjected to a refreshing incurring only a minimum processing cost. Thus, the decrease in access efficiency is further reduced.

Furthermore, in accordance with another embodiment the non-volatile semiconductor memory device of the present invention, refresh operations are performed on a block basis, as selected by a row address of $m_1$ bits and a column address of $m_2$ bits. Thus, the entire memory cell array can be divided into blocks having the desired dimensions along the row and column directions, thereby reducing the redundant refreshing for the still-viable memory cells in[]the relevant block, while sufficiently reducing the amount of time required for each refreshing so the decrease in access efficiency can be securely prevented.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device comprising a plurality of memory cells each including a capacitor as a memory element, the capacitor sandwiching a ferroelectric member, wherein the non-volatile semiconductor memory device further comprises:
a first counter for counting the number of write accesses and read accesses for writing or reading first logic data to each one of the plurality of memory cells;
a second counter for counting the number of write accesses and read accesses for writing or reading second logic data to the memory cell; and
a refresh control circuit for performing, when either a first value counted by the first counter or a second value counted by the second counter exceeds a predetermined value, a refresh operation by applying electric fields for causing a polarization state of the ferroelectric member of the capacitor to make a complete round on a hysteresis curve of the ferroelectric member in a corresponding one of the plurality of memory cells for which the first or second value counted by the first counter or the second counter has exceeded the predetermined value.

2. A non-volatile semiconductor memory device according to claim 1, wherein the first counter does not count any read accesses for reading the first logic data in the case where the polarization state of the ferroelectric member is inverted by reading the first logic data from the corresponding memory cell.

3. A non-volatile semiconductor memory device according to claim 2, wherein the first counter resets the counted first value when a read access for reading the first logic data is made in the case where the polarization state of the ferroelectric member is inverted by reading the first logic data from the corresponding memory cell.

4. A non-volatile semiconductor memory device according to claim 3, wherein the refresh control circuit performs, when the first value counted by the first counter exceeds a predetermined value, a refresh operation by reading the first logic data from the corresponding memory cell and subsequently rewriting the first logic data to the corresponding memory cell at least one time, and the refresh control circuit performs, when the second value counted by the second counter exceeds a predetermined value, a refresh operation by reading the logic data from the corresponding memory, cell, writing data which is obtained by inverting the logic data, and subsequently writing the non-inverted logic data to the corresponding memory cell at least one time.

5. A non-volatile semiconductor memory device comprising $2^{(n_1+n_2)}$ memory cells arrayed in a matrix of $2^{n_1}$ rows × $2^{n_2}$ columns, each memory cell including a capacitor as a memory element, the capacitor sandwiching a ferroelectric member, at least one of the memory cells being selected based on a row address of $n_1$ bits and a column address of $n_2$ bits for an access, wherein the non-volatile semiconductor memory device further comprises:

a row predecoder for predecoding $m_1$ bits among the $n_1$ bits of the row address;

$2^{m_1}$ row subdecoders for subdecoding the other ($n_1-m_1$) bits to select at least one row of the arrayed memory cells, at least one of the $2^{m_1}$ row subdecoders being selected based on an output of the row predecoder;

a column predecoder for predecoding $m_2$ bits among the $n_2$ bits of the column address;

$2^{m_2}$ column subdecoders for subdecoding the other ($n_2-m_2$) bits to select at least one column of the arrayed memory cells, at least one of the $2^{m_2}$ column subdecoders being selected based on an output of the column predecoder;

a plurality of counters for counting the number of accesses to the memory cells in each block selected based on a combination of the output of the row predecoder and the output of the column predecoder; and a refresh control circuit for performing, when a counted value counted by at least one of the plurality of counters exceeds a predetermined value, a refresh operation by applying electric fields for causing a polarization state of the ferroelectric member of the capacitor of all the memory cells within the block corresponding to the counter whose counted value has exceeded the predetermined value to make a complete round on a hysteresis curve of the ferroelectric member.

6. A non-volatile semiconductor memory device according to claim 5, wherein the plurality of counters include:

first counters for counting the number of write accesses and read accesses for writing or reading first logic data to the memory cells within the block;

second counters for counting the number of write accesses and read accesses for writing or reading second logic data to the memory cells within the block, and wherein the refresh control circuit performs, when a counted value counted by at least one of the first counters or the second counters exceeds a predetermined value, a refresh operation for all the memory cells within the block corresponding to the counter whose counted value has exceeded the predetermined value.

7. A non-volatile semiconductor memory device according to claim 6, wherein the refresh control means performs refresh operations for all the memory cells within the block, the memory cells being sequentially selected by:

selecting a column of the block by subdecoding the column address of ($n_2-m_2$) bits obtained by counting a pulse sequence having a predetermined cycle by using a column refresh counter; and selecting a row of the block by subdecoding the row address of ($n_1-m_1$) bits obtained by counting a further pulse sequence by using a row refresh counter, the further pulse sequence being obtained by dividing the pulse sequence having the predetermined cycle by $2^{(n_2-m_2)}$.

* * * * *